United States Patent
Han et al.

(10) Patent No.: US 12,415,327 B2
(45) Date of Patent: Sep. 16, 2025

(54) METHOD FOR MANUFACTURING HIGH TRANSMISSION LIGHT CONTROL FILM AND HIGH TRANSMISSION LIGHT CONTROL FILM

(71) Applicant: LG Display Co., Ltd., Seoul (KR)

(72) Inventors: Jaejung Han, Paju-si (KR); Jinryun Kim, Paju-si (KR); Jusang Rhim, Paju-si (KR); Daeyong Kim, Paju-si (KR); Eunhee Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 397 days.

(21) Appl. No.: 17/977,674

(22) Filed: Oct. 31, 2022

(65) Prior Publication Data

US 2023/0182422 A1 Jun. 15, 2023

(30) Foreign Application Priority Data

Dec. 10, 2021 (KR) .......... 10-2021-0176403

(51) Int. Cl.
| | | |
|---|---|---|
| B29D 11/00 | (2006.01) | |
| G02B 5/00 | (2006.01) | |
| G02B 5/22 | (2006.01) | |
| G02B 5/28 | (2006.01) | |
| G03F 7/00 | (2006.01) | |

(52) U.S. Cl.
CPC .......... *B29D 11/00788* (2013.01); *G02B 5/00* (2013.01); *G02B 5/003* (2013.01); *G02B 5/22* (2013.01); *G02B 5/285* (2013.01); *G02B 2207/123* (2013.01); *G03F 7/0007* (2013.01)

(58) Field of Classification Search
None
See application file for complete search history.

(56) References Cited

U.S. PATENT DOCUMENTS

2017/0371077 A1* 12/2017 Okamoto ............... G02B 7/008

FOREIGN PATENT DOCUMENTS

| CN | 109765643 A | 5/2019 | |
|---|---|---|---|
| CN | 111071984 A | 4/2020 | |
| CN | 113490867 A | 10/2021 | |
| JP | 2021-507285 A | 2/2021 | |
| KR | 10-2009-0012719 A | 2/2009 | |
| KR | 10-2016-0042804 A | 4/2016 | |
| KR | 20170038299 * | 4/2017 | ............... F21V 8/00 |
| KR | 10-2021-0003655 A | 1/2021 | |
| WO | WO2020121112 * | 6/2020 | ............... G02B 5/00 |

* cited by examiner

*Primary Examiner* — Jiong-Ping Lu

(74) *Attorney, Agent, or Firm* — Birch, Stewart, Kolasch & Birch, LLP

(57) ABSTRACT

A method for manufacturing a high transmission light control film and the high transmission light control film are discussed. The high transmission light control film manufactured according to an embodiment can have a high aperture ratio since a louver layer is formed of a thin deposition film having a thickness of nanoscale, thereby having an improved front-view luminance.

10 Claims, 20 Drawing Sheets

METHOD FOR MANUFACTURING HIGH TRANSMISSION LIGHT CONTROL FILM AND HIGH TRANSMISSION LIGHT CONTROL FILM

CROSS REFERENCE TO RELATED APPLICATION

The present application claims priority to Korean Patent Application No. 10-2021-0176403, filed on Dec. 10, 2021 in the Republic of Korea, the entire contents of which are hereby expressly incorporated by reference into the present application.

BACKGROUND OF THE DISCLOSURE

Field

The present disclosure relates to a method for manufacturing a light control film having increased transmission of light, and the light control film manufactured according to the method.

Discussion of the Related Art

In recent years, there have been developed various types of display devices such as cathode ray tube devices, liquid crystal display devices, plasma display panel devices, electroluminescence display devices, and the like. These various types of display devices are used according to unique characteristics thereof to display image data of various products such as computers, mobile phones, automatic bank teller machines (ATMs), vehicle navigation systems, etc.

Each display device displays image information by a user. In general, the display device is developed to have a wide viewing angle so that the user is able to see images of the display device from various angular directions. However, depending on the product to which the display device is applied, the wide viewing angle can adversely affect the characteristics of the product, and thus the product providing a narrow viewing angle can be needed.

For example, for an automatic bank teller machine (ATM), it is more desirable that the ATM has a display with a narrow viewing angle because when a user inputs personal information to the ATM, it needs to prevent other people next to the user from recognizing the user's personal information. Also, when the viewing angle of the display is wide for a vehicle navigation system, light can be reflected on the windshield of the vehicle during driving the vehicle at night, which can adversely affect the safety of the driver. In addition, for a computer or a mobile phone, if a user does not want to expose the privacy data, the wide viewing angle of the display device is desired according to the user's requirement.

It is necessary to design and manufacture a display device to have an appropriately adjusted viewing angle suitable for the field to which the display device is applied. However, if the display device is manufactured separately according to the requirements of each product, it can result in less productivity. Therefore, it has been considered a scheme of manufacturing a display having a wide viewing angle and a narrowing the viewing angle thereafter according to the application field of the display device. To meet the needs under such situation, a light control film that is attached to the displaying surface of the display device to narrow the viewing angle has been developed.

However, the light control film according to the related art can have a limitation of degrading the front-view luminance.

SUMMARY OF THE DISCLOSURE

The limitation of the degraded front-view luminance of the light control film according to the related art can be due to the low aperture ratio of the light control film.

Accordingly, the present disclosure is to address this and other limitations associated with the related art, and relates to a method for manufacturing a light control film having an increased aperture ratio.

The embodiments of the present disclosure are intended to solve or address the above and other limitations, and can have having the characteristics as follows.

A method for manufacturing a high transmission light control film according to an embodiment of the present disclosure includes forming a light transmitting layer including a plurality of slots on a lower layer; forming a louver layer by depositing a light absorbing material on the light transmitting layer; and filling the plurality of slots with resin.

The forming the louver layer includes a first deposition step of depositing the light absorbing material at a first angle to a line vertical to the lower layer; and a second deposition step of depositing the light absorbing material at a second angle symmetrical to the first angle with respect to the line.

The method for manufacturing a high transmission light control film according to an embodiment further includes removing the louver layer deposited on a top surface of the light transmitting layer.

The method for manufacturing a high transmission light control film according to an embodiment further includes etching the louver layer deposited on a top surface of the light transmitting layer.

The method for manufacturing a high transmission light control film according to an embodiment further includes, after the forming the louver layer, peeling off the louver layer deposited on a top surface of the light transmitting layer.

The method for manufacturing a high transmission light control film according to an embodiment further includes, after the filling with the resin, etching a top surface of the light transmitting layer and an upper portion of the resin.

The method for manufacturing a high transmission light control film according to an embodiment further includes, after the filling with the resin, peeling off the louver layer deposited on a top surface of the light transmitting layer, wherein the peeling-off is a selective peeling-off using a pressure-sensitive adhesive or a UV (ultraviolet) release adhesive.

The forming the light transmitting layer is through an imprinting scheme.

A method for manufacturing a high transmission light control film according to another embodiment of the present disclosure includes forming a plurality of light transmitting layers on a lower layer; forming a louver layer by depositing a light absorbing material; and filling with resin, wherein opening portions exposing the lower layer are respectively formed between the plurality of light transmitting layers, and wherein the plurality of light transmitting layers each have a cross-section of a right triangle and each include an inclined plane and a vertical plane perpendicular to the lower layer, and wherein the forming the louver layer includes depositing the light absorbing material on any one of the vertical plane and the inclined plane.

The forming the louver layer is depositing the light absorbing material at an angle greater than 0 degrees and less than an angle formed by the inclined plane and the lower layer.

The forming the louver layer further includes, after the depositing the light absorbing material, etching the light absorbing material deposited in the opening portions.

The plurality of light transmitting layers are formed by patterning via a photolithography process or an electron beam lithography process.

A method for manufacturing a high transmission light control film according to another embodiment of the present disclosure includes depositing a light absorbing material on an X-Y plane of a transparent film having a thickness in a Z-axis direction; stacking, in the Z-axis direction, a plurality of the transparent films on which the light absorbing material is deposited; producing a mother film by pressing and laminating, in the Z-axis direction, the stacked transparent films; producing a plurality of sub-films by slicing the mother film in a direction parallel to a Z-X plane; rotating the sub-film by 90 degrees with respect to an X-axis; and attaching films to upper and lower surfaces of the sub-film.

A method for manufacturing a high transmission light control film according to another embodiment of the present disclosure includes forming a light transmitting layer including a plurality of slots on a lower layer; ejecting ink made of a light absorbing material into the slots using an inkjet nozzle; performing a wipe of the ink ejected into the slots; forming a louver layer by drying the ink; etching the louver layer formed at a surface of the light transmitting layer within the slots; filling the plurality of slots with resin.

A method for manufacturing a high transmission light control film according to another embodiment of the present disclosure includes forming a light transmitting layer including a plurality of opening portions on a lower layer; ejecting ink made of a light absorbing material into the opening portions using an inkjet nozzle; forming a louver layer by drying the ink; filling the plurality of opening portions with resin; and delaminating the lower layer from the light transmitting layer, the louver layer and the resin.

The high transmission light control film manufactured according to an embodiment of the present disclosure has a high aperture ratio because the louver layer is formed of a thin deposition film having a thickness of nanoscale, and has an improved front-view luminance.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
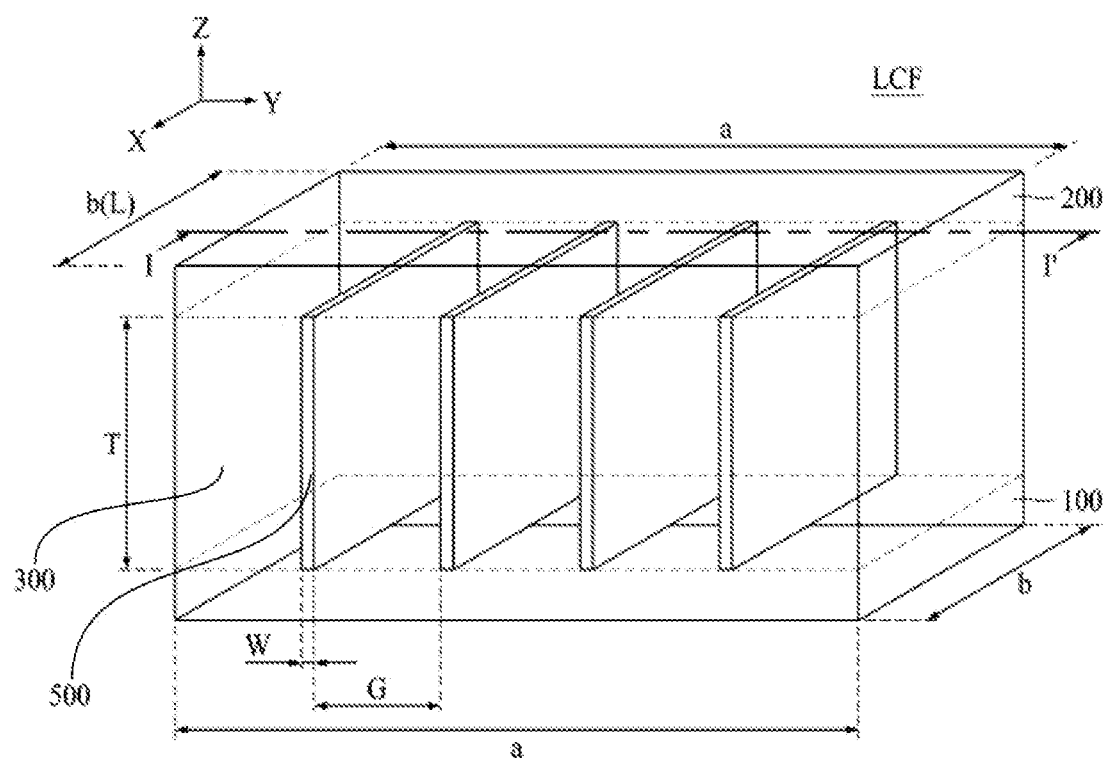
FIG. 1 is a perspective view illustrating a structure of a light control film having a light absorbing layer.

The shapes, sizes, ratios, angles, numbers and the like illustrated in the accompanying drawings for describing the various Embodiments of the present disclosure are merely examples, and the present disclosure is not limited thereto. The same or like reference numerals generally denote the same or like components throughout the specification. Further, in the following description of the present disclosure, a detailed explanation of known related technologies can be omitted to avoid unnecessarily obscuring the subject matter of the present disclosure. The terms such as "comprising," "having," "including" and the like used herein are generally intended to allow other components to be added unless the terms are used with the term "only". Any references to singular can include plural unless expressly stated otherwise.

Components are interpreted to include an ordinary error range even if not expressly stated.

When the positional relation between two parts is described using the terms such as "on", "above", "below", "next to" and the like, one or more parts can be positioned between the two parts unless the terms are used with the term "immediately" or "directly".

Although the terms "first", "second" and the like are used for describing various components, these components are not confined by these terms. These terms are merely used for distinguishing one component from another component, and may not define any order or sequence. Therefore, a first component to be mentioned below can be a second component in a technical concept of the present disclosure.

The same or like reference numerals generally denote the same or like components throughout the specification.

Hereinafter, various embodiments of the present disclosure will be described in detail with reference to accompanying drawings. Names of components used in the following description can be selected in consideration of ease of specification preparation, and thus the names of the components can be different from names of components used in practical products. Further, all the components of each light control film and each apparatus using the light control film according to all embodiments of the present disclosure are operatively coupled and configured.

Figure 2:
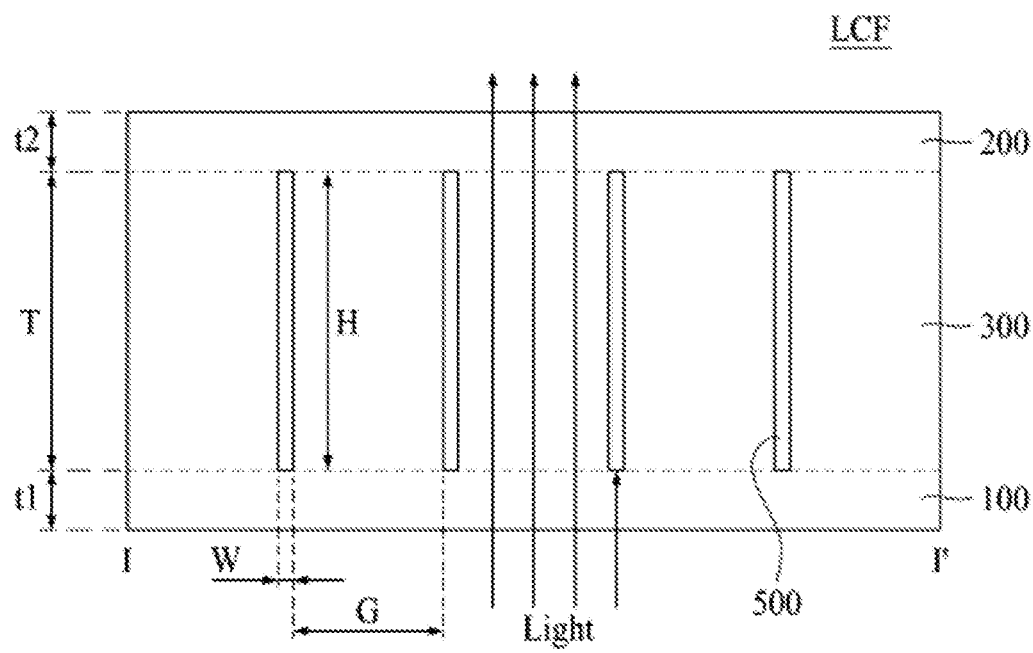
FIG. 2 is a cross-sectional view of the light control film taken along a line I-I'.

FIG. 1 is a perspective view illustrating a structure of a light control film having a light absorbing layer, and FIG. 2 is a cross-sectional view of the light control film taken along a line I-I'.

Referring to FIGS. 1 and 2, a light control film LCF having a light absorbing layer, includes a lower layer 100, an upper layer 200, a light transmitting layer 300 and a louver layer 500. The lower layer 100 can have a plate-like structure having a predetermined first thickness t1. The upper layer 200 can have the same shape as the lower layer 100 and can have a predetermined second thickness t2. The first thickness t1 and the second thickness t2 can be the same. The lower layer 100 and the upper layer 200 face each other at a certain distance, and the light transmitting layer 300 fills therebetween.

The light control film LCF is an optical functional film having a function of emitting incident light only within a certain angle range. Therefore, the lower layer 100, the upper layer 200 and the light transmitting layer 300 can include a transparent material. For example, the lower layer 100, the upper layer 200 and the light transmitting layer 300 can include a transparent organic material.

On the other hand, the louver layer 500 preferably can have a property of absorbing light.

The lower layer 100 has a plate-like structure arranged on a plane where an X-axis and a Y-axis locate. The upper layer 200 can have the same shape as the lower layer 100. The upper layer 200 and the lower layer 100 can be spaced apart by a certain distance in the Z-axis direction. The light transmitting layer 300 is interposed between the lower layer 100 and the upper layer 200, and can have a predetermined height T along the Z-axis.

The louver layer 500 has a thickness W in the Y-axis direction, a length L in the X-axis direction, and a height H in the Z-axis direction. A plurality of the louver layers 500 are disposed at a regular distance G along the Y-axis in the light transmitting layer 300 and thus block light from a specific direction. The length L of the louver layer 500 can be equal to the length b of the lower layer 100. Referring to FIGS. 1 and 2, the length L of the louver layer 500 can be equal to the length of the light transmitting layer 300 in the X-axis direction. Also, the height H of the louver layer 500 can be the same as the height T of the light transmitting layer 300 in the Z-axis direction.

An aperture ratio OR of the light control film can be defined as Equation 1 as below.

$$OR = \frac{G}{(W+G)} \quad \text{[Equation 1]}$$

Here, G is an arrangement distance between the louver layers 500, and W is a thickness of the louver layer 500. When light is irradiated in a direction of the normal line of the surface of the lower layer 100, a portion of the light is absorbed by the cross-section of the louver layer 500, and only the light passing through the light transmitting layer 300 is transmitted and emitted out of the upper layer 200. Therefore, as the aperture ratio OR of the light control film is low, the front-view luminance of the light control film becomes low. Therefore, as the thickness W of the louver layer 500 is thinner, the higher front-view luminance of the light control film can be achieved.

The embodiments of the present disclosure relate to a method for manufacturing a high transmission light control film including a louver layer 500 having a thickness of nanoscale.

Embodiment A

Figure 3:
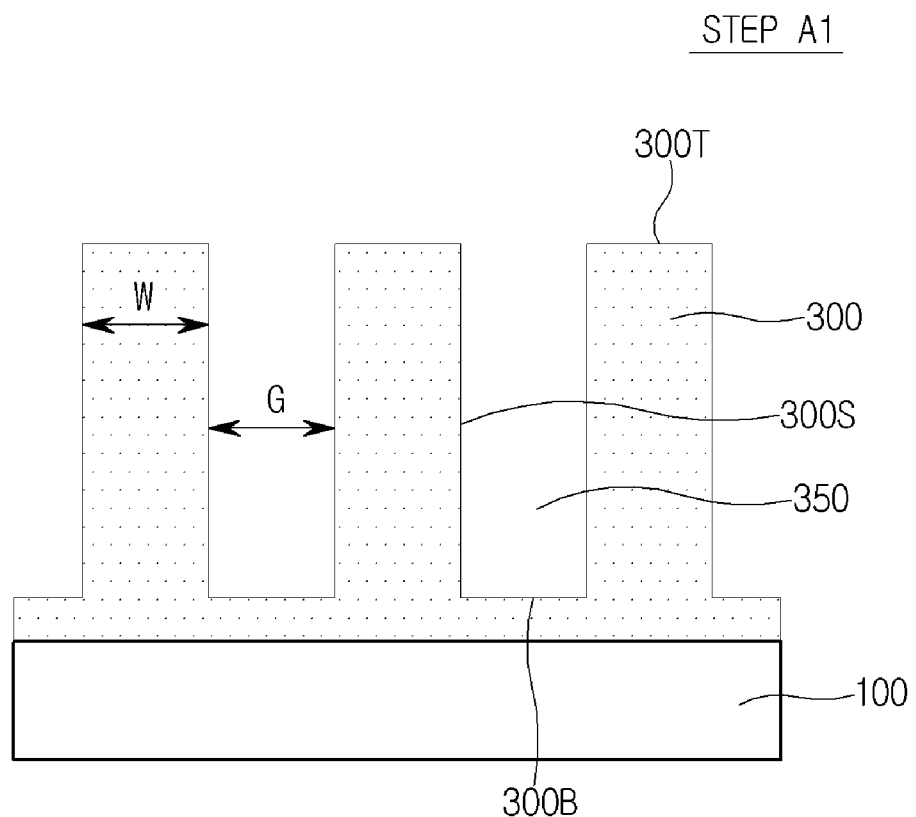
FIGS. 3 to 6 illustrate a method for manufacturing a high transmission light control film according to Embodiment A of the present disclosure.
Figure 4:
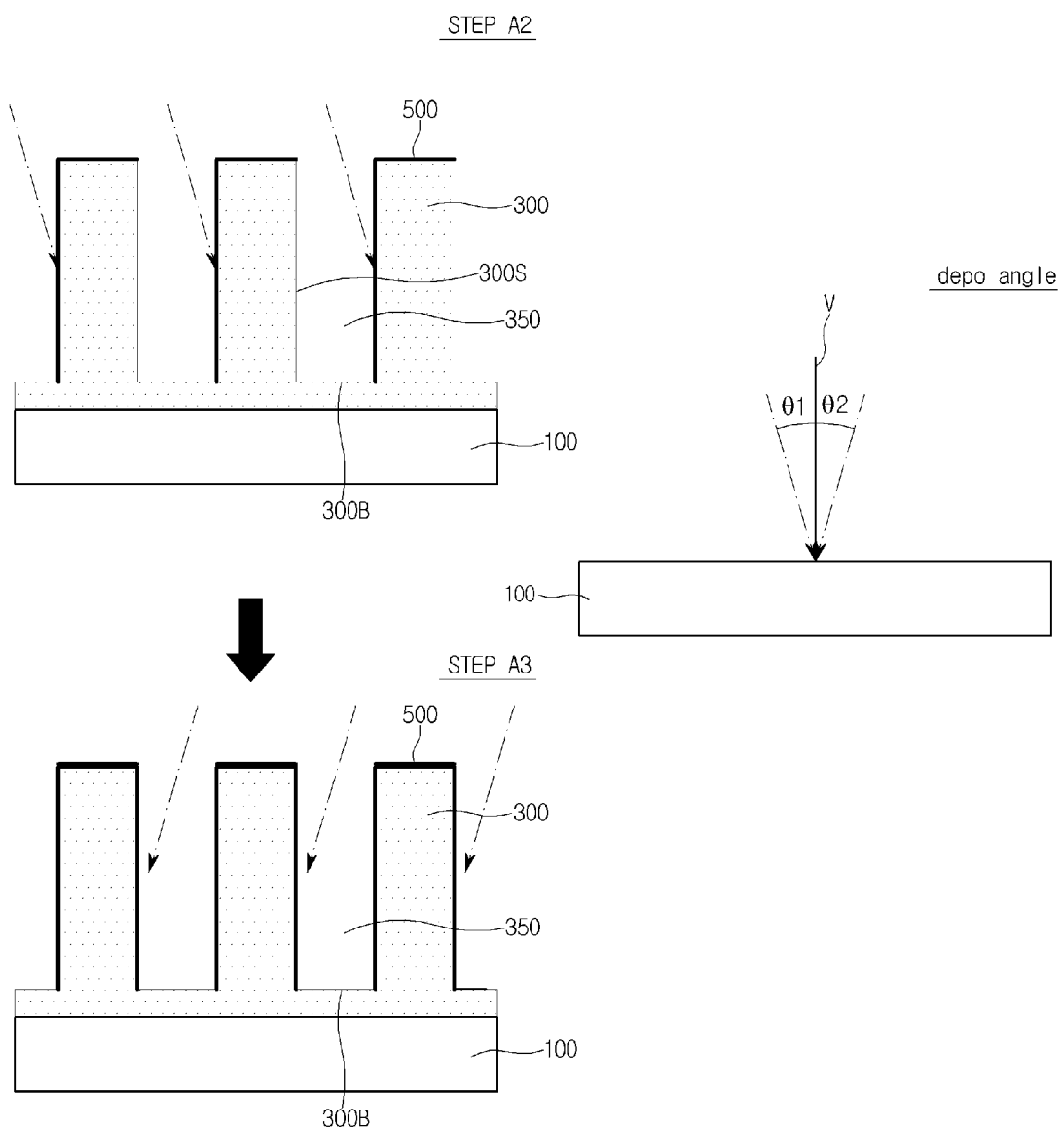
Figure 5:
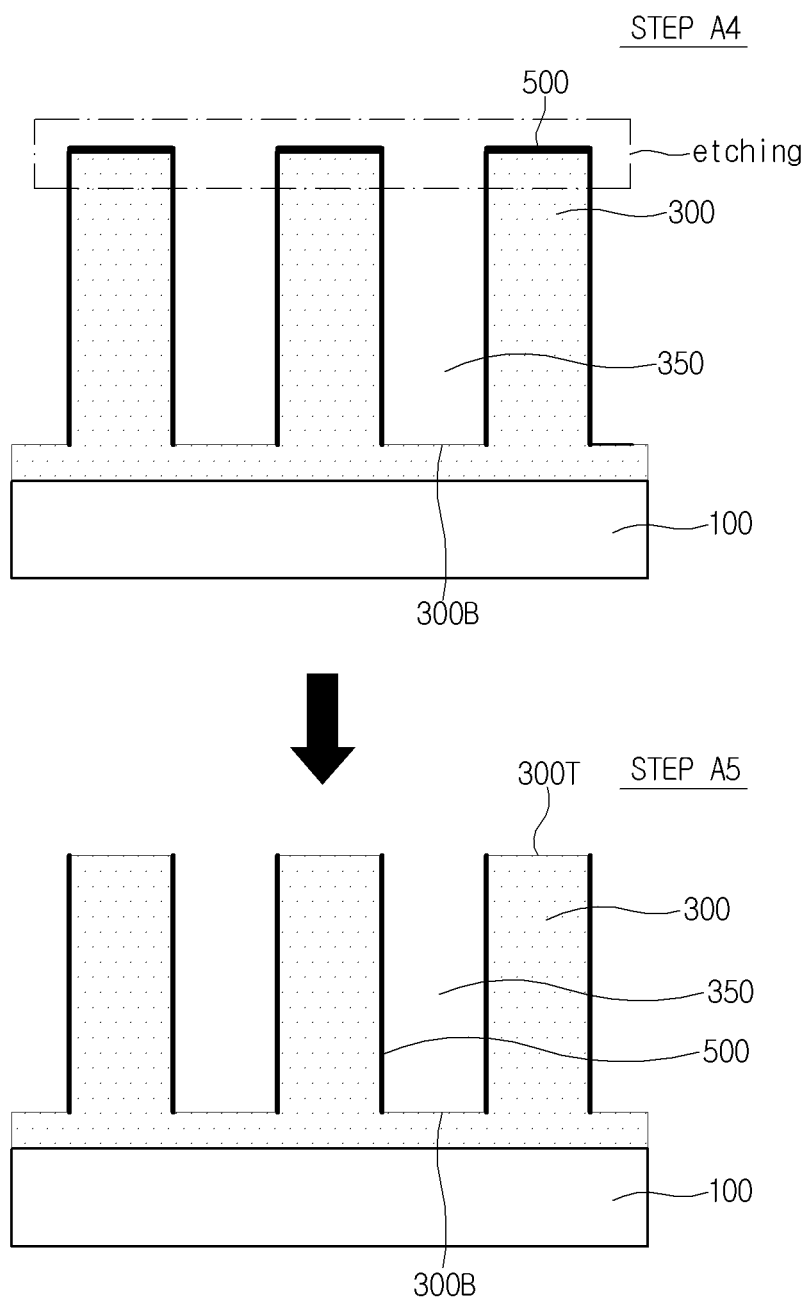

FIGS. 3 to 5 illustrate a method for manufacturing a high transmission light control film according to Embodiment A of the present disclosure.

Referring to FIGS. 3 to 5, the method for manufacturing a high transmission light control film according to Embodiment A includes forming a light transmitting layer 300 including a plurality of slots 350 on a lower layer 100 (STEP A1), forming a louver layer 500 by depositing a light absorbing material on the light transmitting layer 300 (STEP A2, STEP A3), removing (for example etching) the louver layer 500 deposited on a top surface 300T of the light transmitting layer 300 (STEP A4, STEP A5), and filling the plurality of slots with resin (STEP A6).

FIG. 3 illustrates the step of forming a light transmitting layer 300 including a plurality of slots 350 on a lower layer 100 (STEP A1). The light transmitting layer 300 can include a transparent organic material. For example, it can include at least one of organic materials such as an acrylic resin material, polyvinyl chloride (PVC), polyethylene terephthalate (PET), polyacrylate, polyurethane, polycarbonate, polypropylene, and the like.

A pattern of the light transmitting layer 300 can be formed through an imprinting scheme. The imprinting scheme is a process of forming a pattern on the light transmitting layer 300 by pressing a mold having a pattern thereon on the light transmitting layer 300 and then separating the mold after a certain period of time such that the pressed portion has the pattern same with the mold pattern. When manufacturing via the imprint scheme, there can be saving in costs by not using a photoresist (hereinafter, PR) compared with manufacturing using the PR. Further, in the case of manufacturing by the imprint scheme, since the PR is not used, a tact time required to complete the production of the light control film can be reduced, and thus a yield of the light control film can be improved. In order for the louver layers 500 to have a regular distance from each other, it is preferable that the thickness W of the light transmitting layer 300 and the width G of the slot 350 are the same. It is because, when the louver layers 500 absorbing light are respectively formed on both side surfaces 300S of the light transmitting layer 300, the louver layers 500 should have a regular distance from each other to ensure uniform optical properties of the light control film.

FIG. 4 illustrates the step of forming the louver layer 500 by depositing a light absorbing material on the light transmitting layer 300 (STEP A2, STEP A3).

The step of forming the louver layer 500 includes a first deposition step A2 and a second deposition step A3. It is preferable that the louver layer 500 has a light absorbing property. For example, it can include an opaque material such as a metal material, a metal oxidizing material, a nitride material or a carbon allotrope. Specifically, it includes any one selected from silicon nitride (SiN), titanium nitride (TiN), silicon carbide (SiC), Tantalum (Ta), Titanium (Ti), Tungsten (W), nickel (Ni), copper oxide (CuO), aluminum oxide (Al2O3), iron oxide (Fe3O4), nickel oxide (NiO) and tantalum oxide (Ta2O5). Alternatively, the louver layer 500 can be formed of a carbon allotrope such as graphene, carbon nanotubes, or fullerene. In addition, the louver layer 500 can be formed of an organic material having an excellent light absorbing property.

In the first deposition step A2, the light absorbing material is deposited at a first angle θ1 to a line V vertical to the lower layer 100. In the second deposition step A3, the light absorbing material is deposited at a second angle θ2 to the line V vertical to the lower layer 100. In order to deposit the light absorbing material on the side surface 300S of the light transmitting layer 300, the first angle θ1 should be greater than 0 degrees and less than 90 degrees.

In addition, in order for the light absorbing materials deposited on both of the side surfaces 300S of the light transmitting layer 300 to have the same thickness, it is preferable that the first angle θ1 and the second angle θ2 are the angles that are symmetrical with respect to the vertical line V (refer to "depo angle" of FIG. 4). It is because the thickness of the light absorbing material deposited on the side surface 300S of the light transmitting layer 300 is proportional to the cosine value of the first angle θ1 or the cosine value of the second angle θ2 (COS θ1, COS θ2). In order for the light control film to have uniform optical properties, the louver layer 500 should have a uniform thickness, and thus it is preferable the first angle θ1 and the second angle θ2 are the angles symmetrical with respect to the vertical line V.

Figure 6:
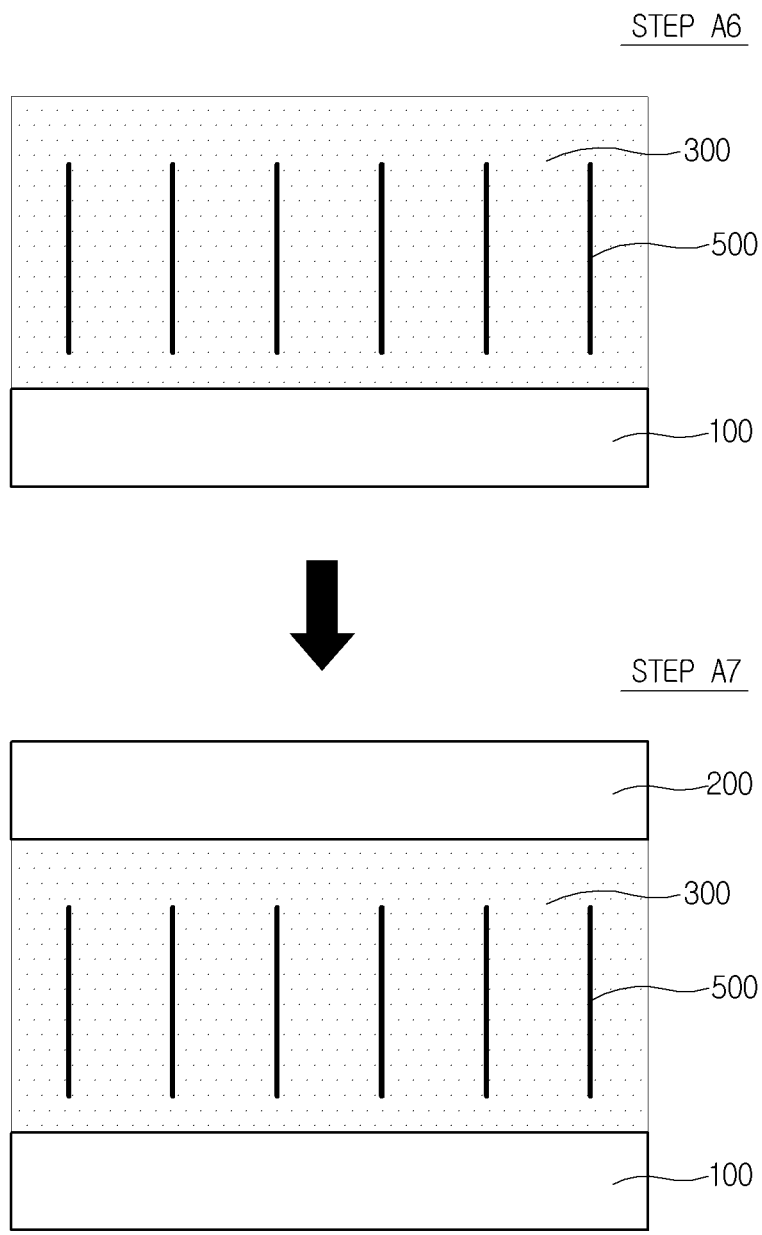

FIG. 5 illustrates the step of etching. FIG. 6 illustrates the steps of filling with resin and attaching an upper layer.

Here, STEP A4 and STEP A5 are etching the louver layer 500 deposited on the top surface 300T of the light transmitting layer 300. In the deposition step of FIG. 4, a part of the louver layer 500 can be deposited on a bottom surface 300B of the light transmitting layer 300. Since the louver layer 500 deposited on the bottom surface 300B can impair optical properties of the light control film, it is preferable in STEP A4 and STEP A5 to remove the residual part of the louver layer 500 deposited on the bottom surface 300B of the light transmitting layer 300 as well as the louver layer 500 deposited on the top surface 300T of the light transmitting layer 300 by etching together. STEP A6 is the step of filling the plurality of slots 350 with resin. In order to ensure uniform optical properties of the light control film, it is preferable that the resin is formed of a substance having the same optical properties as the light transmitting layer 300.

STEP A7 is the step of attaching an upper layer 200 onto the light transmitting layer 300. The upper layer 200 can have the same shape as the lower layer 100.

In Embodiments B to J described below, the lower layer 100 is disposed below the light transmitting layer 300 and the upper layer 200 is disposed on the light transmitting layer 300 like as Embodiment A, and thus the illustration and detailed description of the lower layer 100 and the upper layer 200 will be omitted.

Embodiment B

Figure 7:
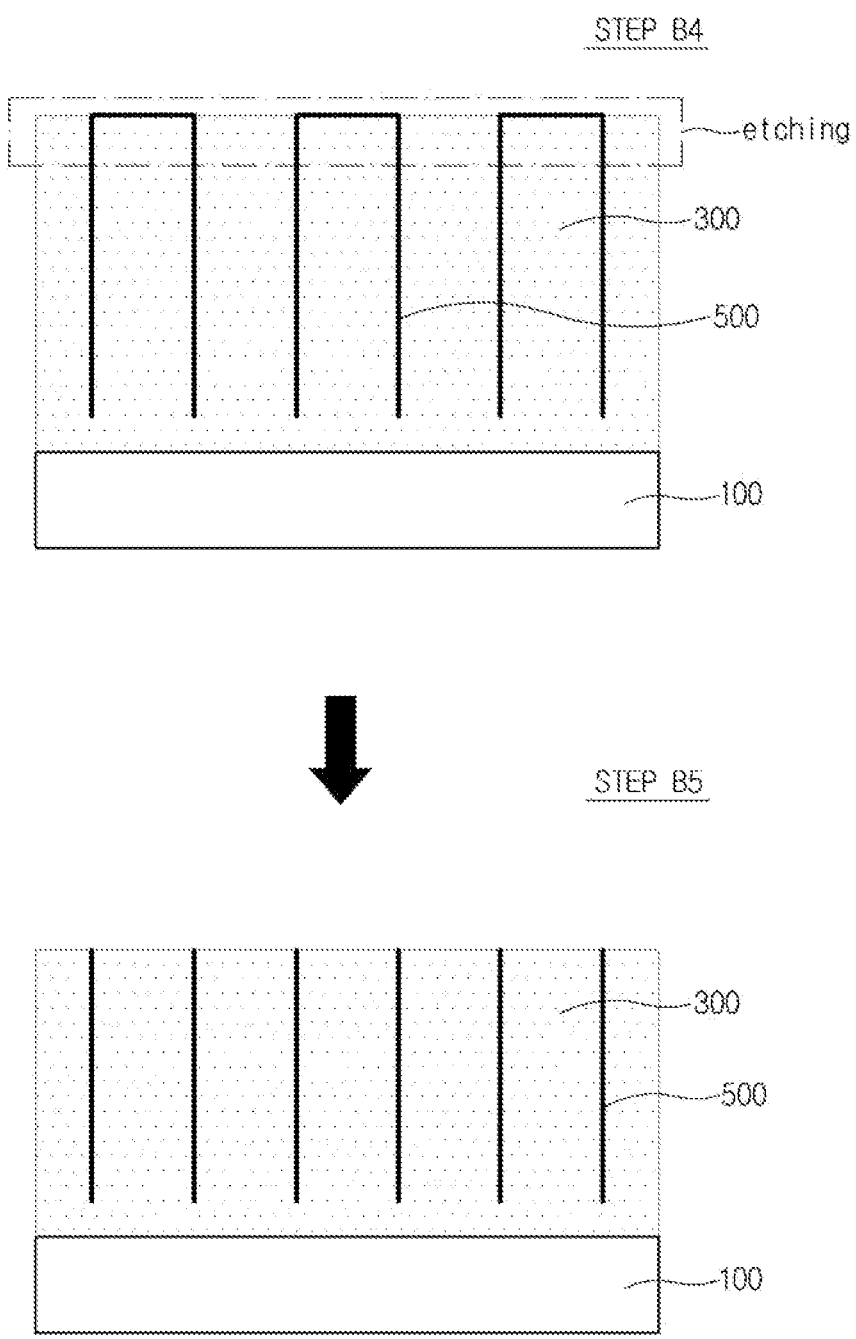
FIG. 7 illustrates a method for manufacturing a high transmission light control film according to Embodiment B of the present disclosure.

FIG. 7 illustrates a method for manufacturing a high transmission light control film according to Embodiment B of the present disclosure.

Referring to FIG. 7, the method for manufacturing a high transmission light control film according to Embodiment B includes forming a light transmitting layer 300 including a plurality of slots 350 on a lower layer 100 (same as STEP A1), forming a louver layer 500 by depositing a light absorbing material on the light transmitting layer 300 (same as STEP A2 and STEP A3), filling the plurality of slots with resin (STEP B4), and etching the louver layer 500 deposited on a top surface 300T of the light transmitting layer 300 (STEP B5).

Embodiment B is different from Embodiment A in that the louver layer 500 deposited on the top surface 300T of the light transmitting layer 300 is etched after the resin is filled. In the case of Embodiment B, when a part of the louver layer 500 is deposited on the bottom surface 300B of the light transmitting layer 300, the residual part of the louver layer 500 deposited on the bottom surface 300B of the light transmitting layer 300 cannot be removed by etching together, unlike STEP A4 and STEP A5 of FIG. 5. Therefore, when a part of the louver layer 500 is deposited on the bottom surface 300B of the light transmitting layer 300, it is preferable to manufacture the high transmission light control film by the manufacturing method according to Embodiment A.

Embodiment C

Figure 8:
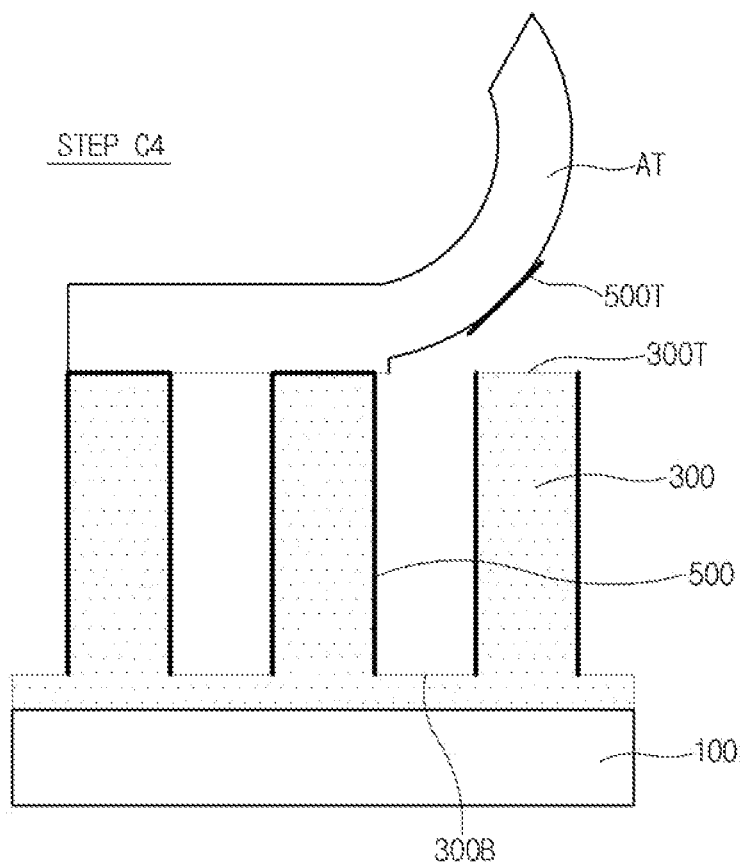
FIG. 8 illustrates a method for manufacturing a high transmission light control film according to Embodiment C of the present disclosure.
Figure 8:
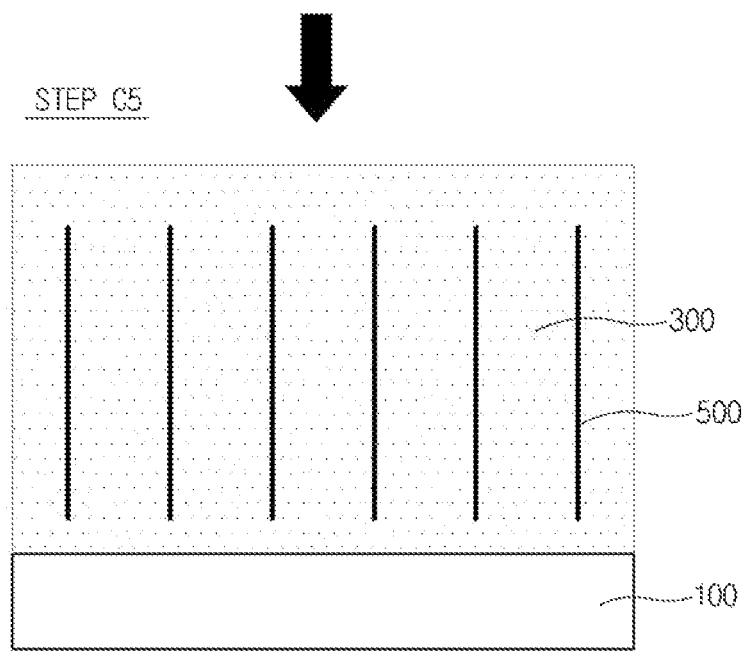

FIG. 8 illustrates a method for manufacturing a high transmission light control film according to Embodiment C of the present disclosure.

Referring to FIG. 8, Embodiment C is a modified example of Embodiment A and has a difference in the scheme for removing the louver layer 500 deposited on the top surface 300T of the light transmitting layer 300.

While, in Embodiment A, the louver layer 500 deposited on the top surface 300T of the light transmitting layer 300 is removed by etching, an adhesive tape AT is used to peel-off the louver layer 500 deposited on the top surface 300 T of the light transmitting layer 300 (STEP C4) in Embodiment C. After the peeling-off, the plurality of slots 350 are filled with resin (STEP C5), which is the same as the process of STEP A6 of Embodiment A.

Embodiment D

Figure 9:
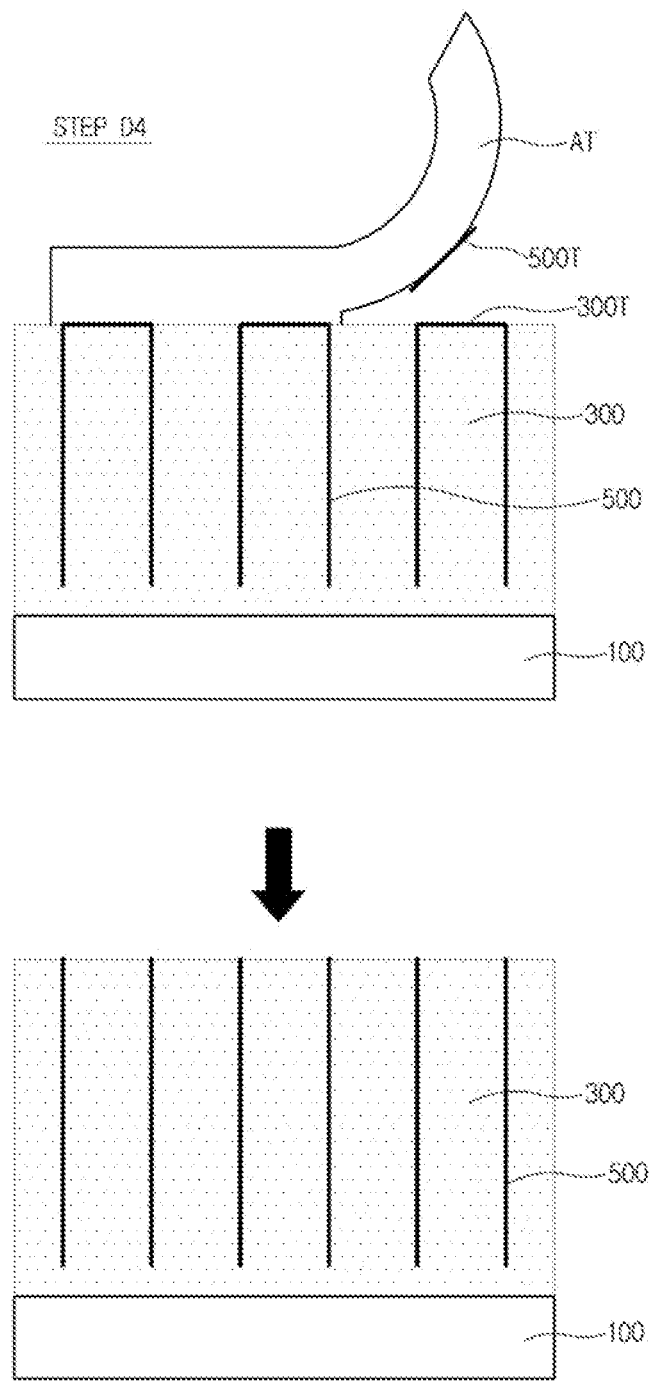
FIG. 9 illustrates a method for manufacturing a high transmission light control film according to Embodiment D of the present disclosure.

FIG. 9 illustrates a method for manufacturing a high transmission light control film according to Embodiment D of the present disclosure.

Referring to FIG. 9, Embodiment D is a modified example of Embodiment B and has a difference in the scheme for removing the louver layer 500 deposited on the top surface 300T of the light transmitting layer 300.

In Embodiment D, the louver layer 500 deposited on the top surface 300T of the light transmitting layer 300 is removed after the resin is filled, like as Embodiment B. In Embodiment D, the louver layer 500 deposited on the top surface 300 T of the light transmitting layer 300 is peeled off using an adhesive tape AT (STEP D4). A pressure-sensitive adhesive or a UV (ultraviolet) release adhesive can be used as the adhesive tape AT. In order not to damage the area where the resin is filled, it is preferable to selectively peel-off only the louver layer 500T deposited on the top surface 300T. Since the pressure-sensitive adhesive has an adhesive force only in the portion subject to pressure, it is possible to selectively peel-off only the louver layer 500T deposited on the top surface 300T. In addition, the UV release adhesive loses its adhesive force only in the area irradiated with UV light. Therefore, by irradiating UV light only to the area where the resin is filled, only the louver layer 500T deposited on the top surface 300T can be selectively peeled off without damage to the area where the resin is filled.

In Embodiment D, like as Embodiment B, when a part of the louver layer 500 is deposited on the bottom surface 300B of the light transmitting layer 300, the residual part of the louver layer 500 deposited on the bottom surface 300B of the light transmitting layer 300 may not be removed together.

Embodiment E

Figure 10:
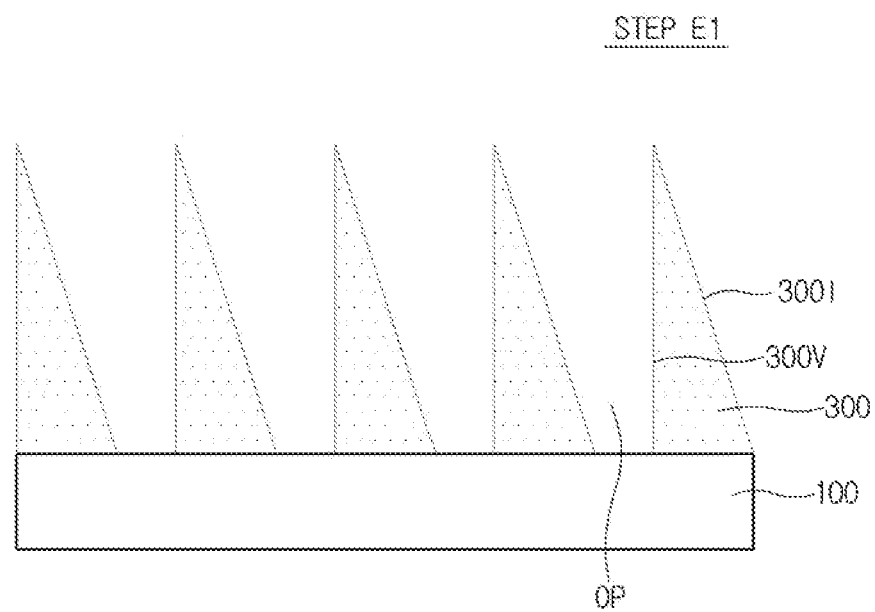
FIGS. 10 to 12 illustrate a method for manufacturing a high transmission light control film according to Embodiment E of the present disclosure.
Figure 11:
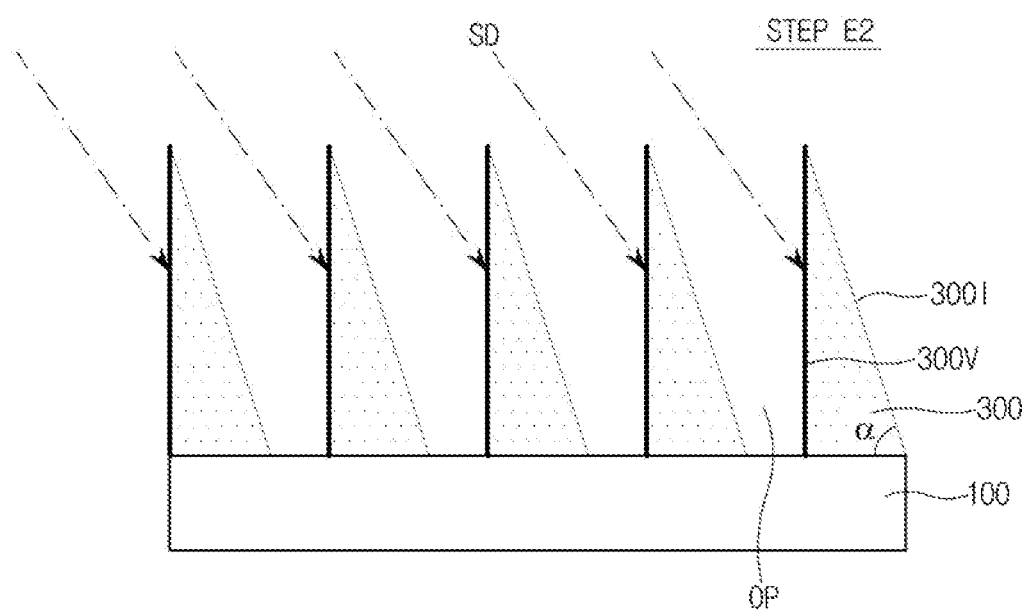
Figure 11:
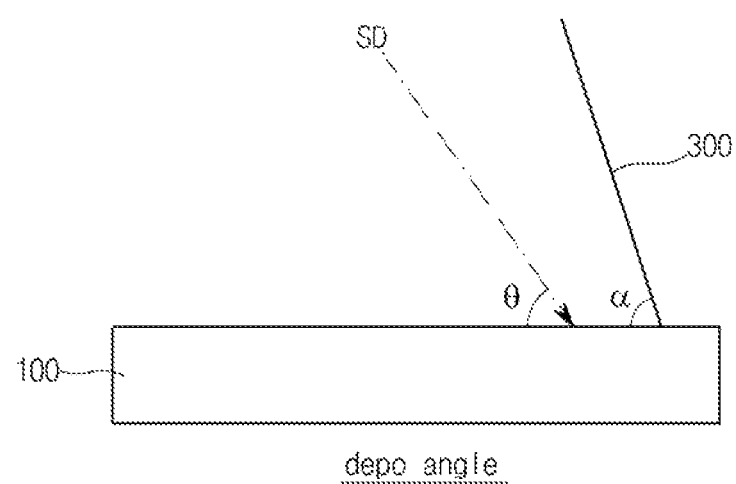
Figure 12:
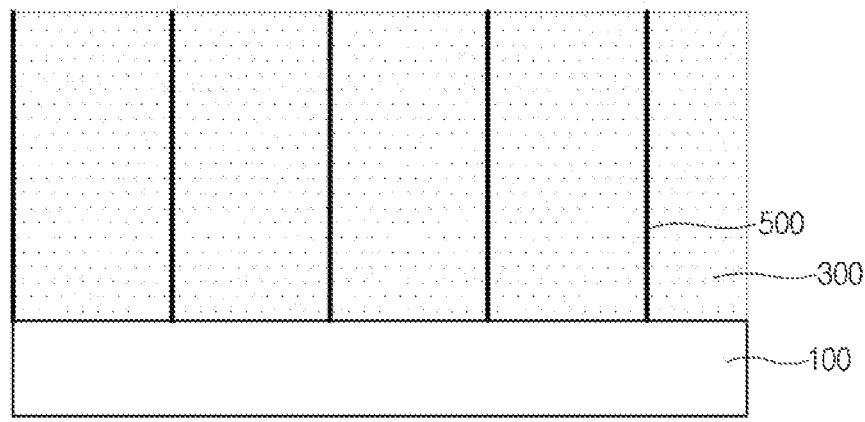

FIGS. 10 to 12 illustrate a method for manufacturing a high transmission light control film according to Embodiment E of the present disclosure.

Referring to FIGS. 10 to 12, the method for manufacturing a high transmission light control film according to Embodiment E includes forming a plurality of light transmitting layers 300 on a lower layer 100 (STEP E1), forming a louver layer 500 by depositing a light absorbing material (STEP E2), and filling with resin (STEP E3). Embodiment E has an advantage in that, unlike the above-described Embodiments A to D, the step of removing (etching or peeling off) the louver layer 500 can be omitted. Further, Embodiment E can provide a high-transmission light control film in two types, for example, the angle formed by the louver layer 500 and the lower layer 100 is a right angle and an oblique angle, by adjusting the angle of depositing the light absorbing material. When the angle formed by the louver layer 500 and the lower layer 100 is a right angle, the front-view luminance is the highest.

When the angle formed by the louver layer 500 and the lower layer 100 is an oblique angle, the luminance is highest in the side direction. The aforesaid is useful for the display device mounted on a vehicle. It is because drivers often view the display device from the side rather than the front.

FIG. 10 illustrates the step of forming a plurality of light transmitting layers 300 on a lower layer 100 (STEP E1).

Opening portions OP that expose the lower layer 100 are respectively formed between the plurality of light transmitting layers 300. The plurality of light transmitting layers 300 have a cross-section of a right triangle including a vertical plane 300V perpendicular to the lower layer 100 and an inclined plane 300I. It is preferable that the plurality of light-transmitting layers 300 are spaced regularly in order for the louver layers 500 to have a regular distance from each other. It is because, when a louver layer 500 absorbing light is formed on any one of the vertical plane 300V or the inclined plane 300I of the light transmitting layer 300, the louver layers 500 should have a regular distance from each other in order to ensure uniform optical properties of the light control film.

The light transmitting layer 300 is patterned via a photolithography process or an electron beam lithography process.

FIG. 11 illustrates the step of forming the louver layer 500 by depositing a light absorbing material (STEP E2).

The light absorbing material is formed on any one of the vertical plane 300V or the inclined plane of the light transmitting layer 300. The light absorbing material can be formed on any one of the vertical plane 300V or the inclined plane of the light transmitting layer 300 by adjusting the angle θ at which the light absorbing material is deposited. When the light absorbing material is deposited on the vertical plane 300V, the angle formed by the louver layer 500 and the lower layer 100 is a right angle. When the light absorbing material is deposited on the inclined plane 300I, the angle formed by the louver layer 500 and the lower layer 100 is an oblique angle.

When the light absorbing material is deposited on the vertical plane 300V, the deposition angle θ should be greater than 0 degrees. When the light absorbing material is deposited on the vertical plane 300V, it is preferably not to be deposited on the inclined plane 300I of the light transmitting layer 300. Therefore, it is preferable that the deposition angle is smaller than an angle α between the inclined plane 300I and the lower layer 100. For example, the deposition angle θ should be greater than 0 degrees and smaller than the angle α between the inclined plane 300I and the lower layer 100, i.e., (0<θ<α).

When the light absorbing material is deposited on the inclined plane 300I, the deposition angle θ should be greater than the angle α between the inclined plane 300I and the lower layer 100 and less than 180 degrees. Since it is most efficient to deposit the light absorbing material in a direction perpendicular to the inclined plane 300I, it is preferable the deposition angle θ is preferably 90+α degrees when the light absorbing material is deposited on the inclined plane 300I.

FIG. 12 illustrates the step of filling with resin (STEP E3).

In order to ensure uniform optical properties of the light control film, it is preferable that the resin is formed of a substance having the same optical properties as the light transmitting layer 300.

Embodiment F

FIGS. 13 to 17 illustrate a method for manufacturing a high transmission light control film according to Embodiment F of the present disclosure.

Referring to FIGS. 13 to 17, a method for manufacturing a high transmission light control film according to Embodiment F includes depositing a light absorbing material LA on an X-Y plane of a transparent film TF having a thickness in a Z-axis direction (STEP F1); producing a mother film MF by stacking, in the Z-axis direction, the transparent film TF on which the light absorbing material is deposited, and pressing and laminating the stacked transparent film TF in the Z-axis direction (STEP F2); producing a plurality of sub-films SF by slicing the mother film MF in a direction parallel to a Z-X plane (STEP F3); rotating the sub-film by 90 degrees with respect to an X-axis (STEP F4); and attaching films to upper and bottom surfaces of the sub-film (STEP F5).

Figure 13:
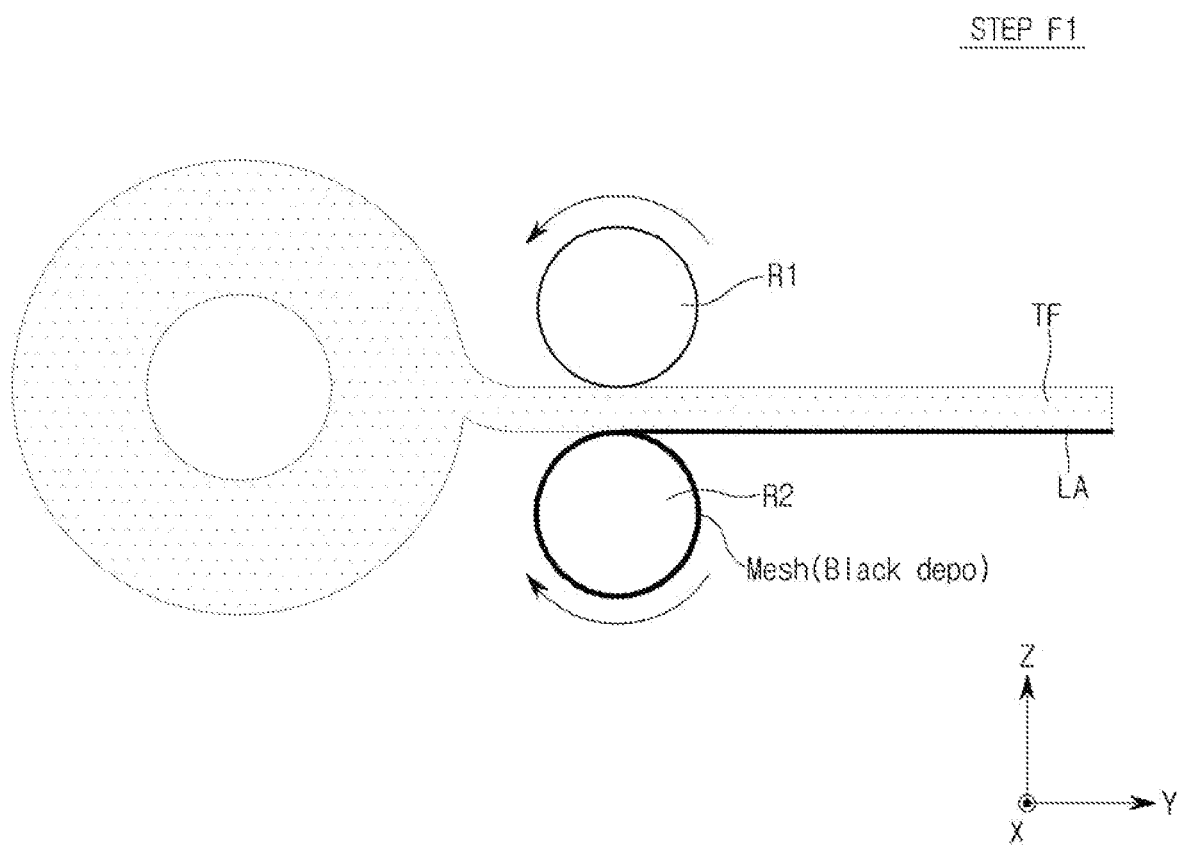
FIGS. 13 to 17 illustrate a method for manufacturing a high transmission light control film according to Embodiment F of the present disclosure.

FIG. 13 illustrates the step of depositing a light absorbing material LA on a transparent film TF (STEP F1). The transparent film TF has a thickness in the Z-axis direction, and the light absorbing material LA is deposited on the X-Y plane of the transparent film TF. The light absorbing material LA is pressed while passing between a first roll R1 and a second roll R2, and can be deposited on the X-Y plane of the transparent film TF.

The transparent film TF can include a transparent organic material. For example, it can include at least one of organic materials such as an acrylic resin material, polyvinyl chloride (PVC), polyethylene terephthalate (PET), polyacrylate, polyurethane, polycarbonate, polypropylene and the like.

The light absorbing material LA can include an opaque material such as a metal material, a metal oxidizing material, a nitride material or a carbon allotrope. Specifically, it includes any one selected from silicon nitride (SiN), titanium nitride (TiN), silicon carbide (SiC), Tantalum (Ta), Titanium (Ti), Tungsten (W), nickel (Ni), copper oxide (CuO), aluminum oxide ($Al_2O_3$), iron oxide ($Fe_3O_4$), nickel oxide (NiO) and tantalum oxide ($Ta_2O_5$).

Figure 14:
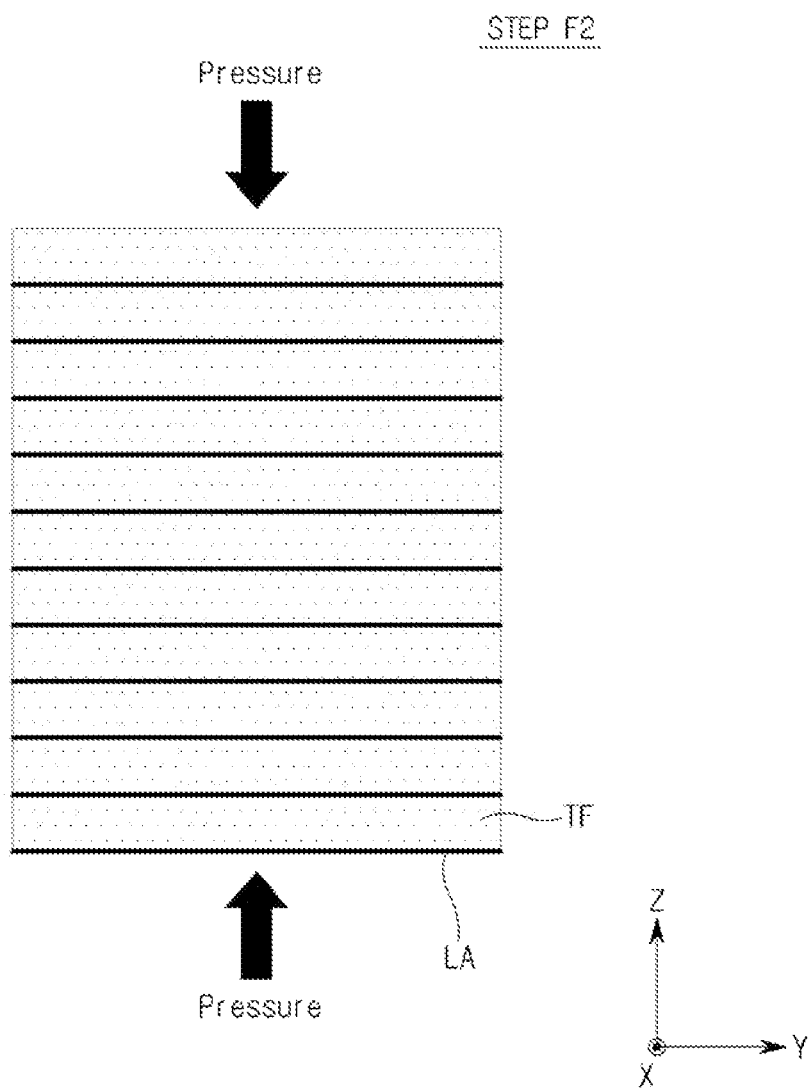

FIG. 14 illustrates the step of producing a mother film MF (STEP F2). The transparent film TF on which the light absorbing material LA is deposited is stacked in the Z-axis direction, and the stacked transparent film TF is pressed and laminated in the Z-axis direction, thereby forming a mother film MF. The transparent film TF and the light absorbing material LA are reduced in thickness through the laminating process. In addition, the respective distances between the transparent films TF and between the light absorbing materials LA are also reduced.

Figure 15:
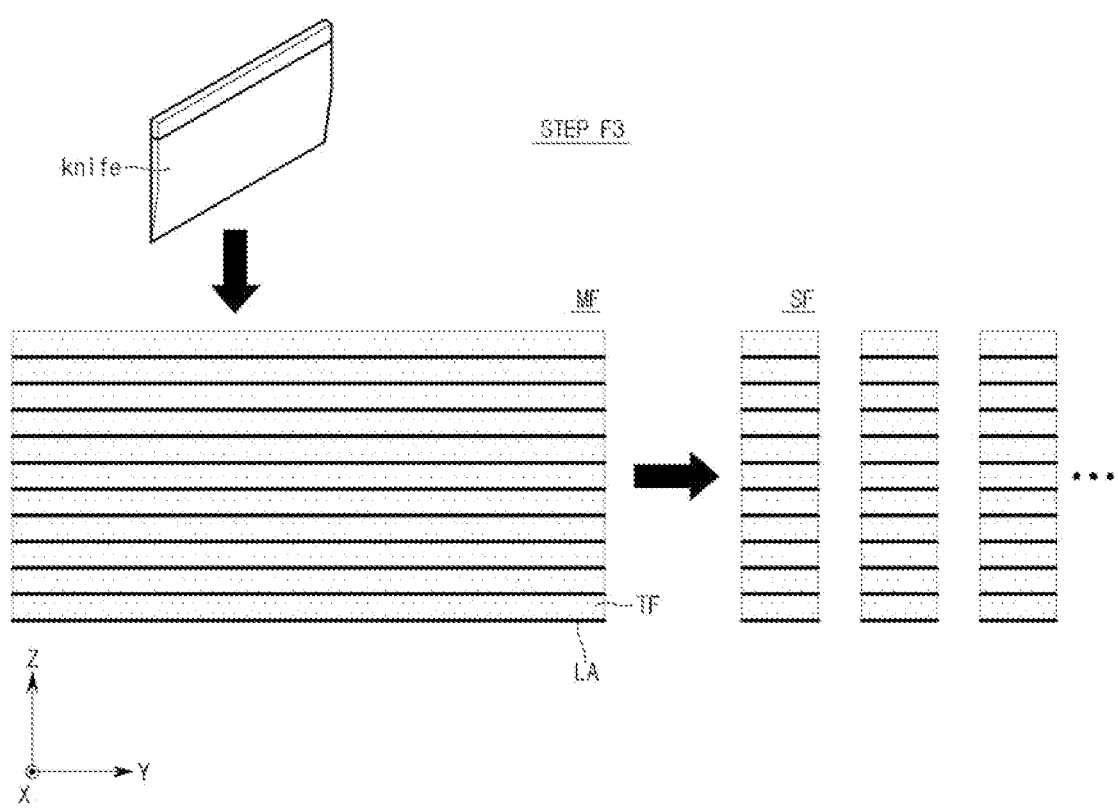

FIG. 15 illustrates the step of producing a plurality of sub-films SF (STEP F3). The plurality of sub-films SF are produced by slicing the mother film MF in a direction parallel to the Z-X plane.

Figure 16:
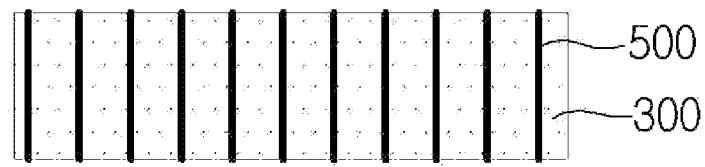
Figure 16:
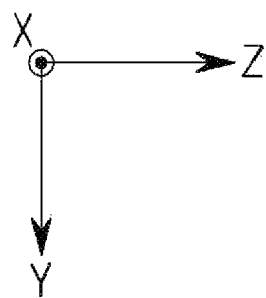

FIG. 16 illustrates the step of rotating the sub-film SF by 90 degrees in a clockwise or counterclockwise direction with respect to the X-axis (STEP F4).

Figure 17:
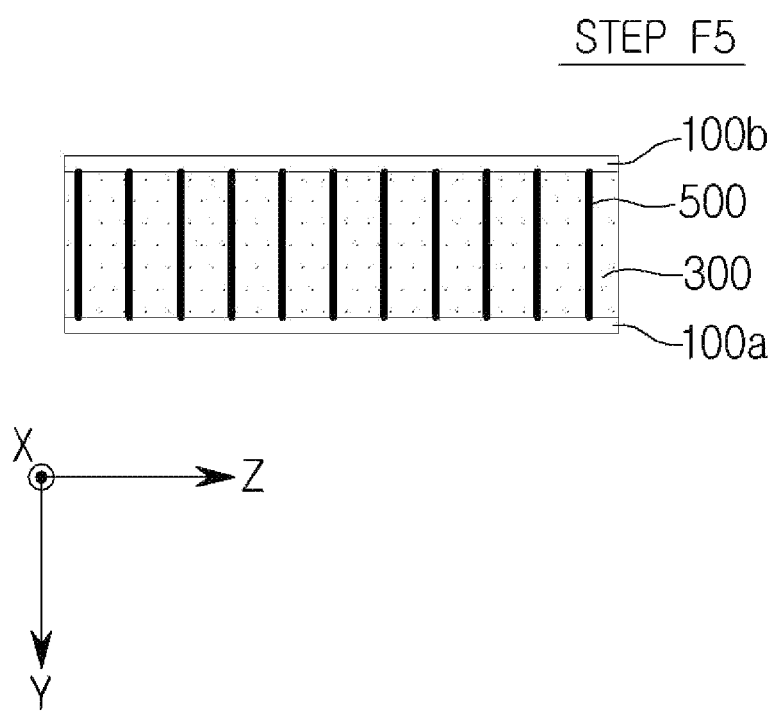

FIG. 17 illustrates the step of attaching films to the upper and lower surfaces of the sub-film SF (STEP F5).

The upper film 100a and the lower film 100b are attached to the upper and lower surfaces of the sub-film SF so that forming the high transmission light control film is completed.

Embodiment G

Figure 18:
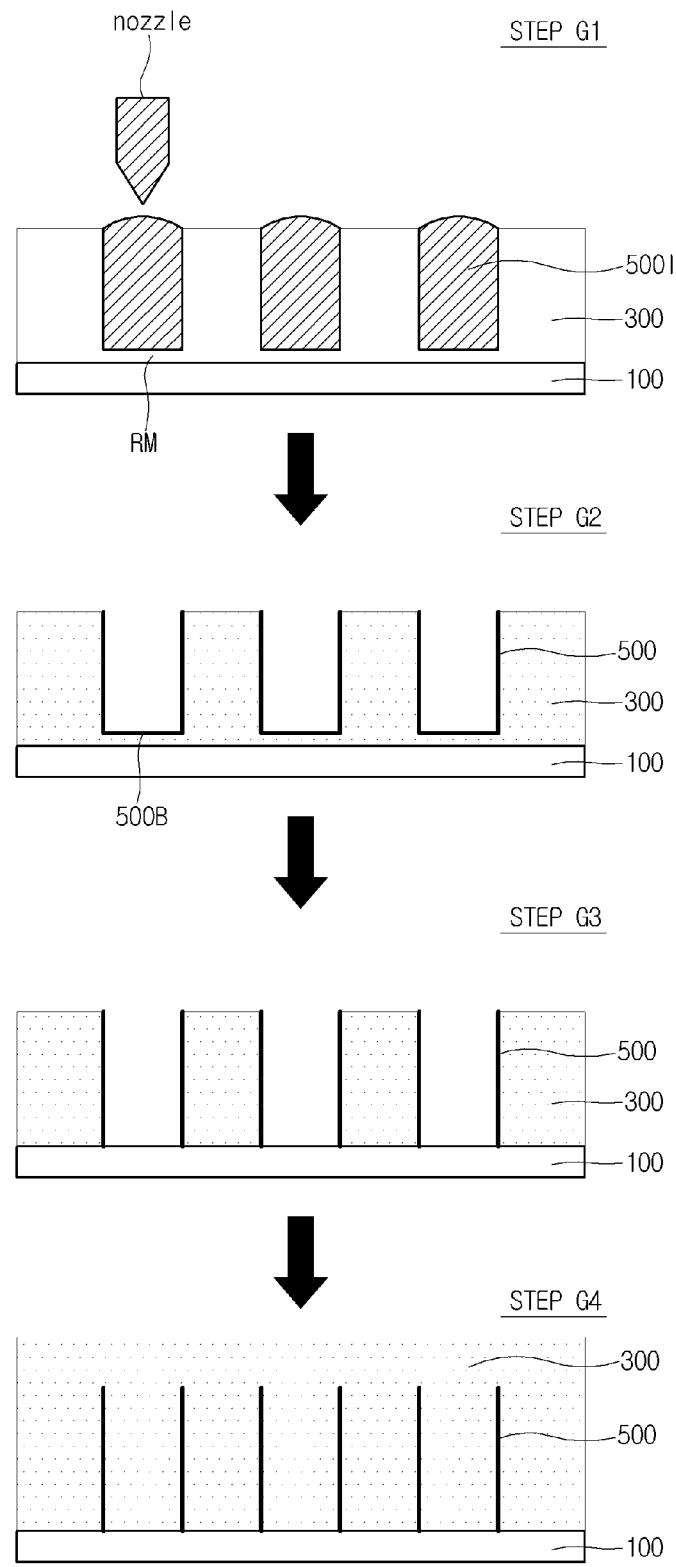
FIG. 18 illustrates a method for manufacturing a high transmission light control film according to Embodiment G of the present disclosure.

FIG. 18 illustrates a method for manufacturing a high transmission light control film according to Embodiment G of the present disclosure.

Referring to FIG. 18, the method for manufacturing a high transmission light control film according to Embodiment G includes forming a light transmitting layer 300 including a plurality of slots 350 on a lower layer 100 (STEP G0); ejecting ink 500I made of a light absorbing material into the slot 350 using an inkjet nozzle (STEP G1); forming a louver layer 500 by drying the ink (STEP G2); etching the louver layer 500B formed on the bottom surface of the light transmitting layer (STEP G3); and filling the plurality of slots 350 with resin (STEP G4).

The step of forming the light transmitting layer 300 in STEP G0 is the same as that described in Embodiment A.

In the step of ejecting the ink 500I of STEP G1, the ink 500I made of a light absorbing material is filled into the slot 350 in a dotting manner using an inkjet nozzle.

The step of forming the louver layer 500 of STEP G2 is forming the louver layer 500 as a thin film along the inner wall surface of the slot 350 by drying the ink 500I.

The step of etching the louver layer 500 of STEP G3 is etching the louver layer 500B formed on the surface of the light transmitting layer 300 within the slot 350.

STEP G4 is the step of filling the plurality of slots 350 with resin so that forming the high transmission light control film is completed.

Embodiment H

Figure 19:
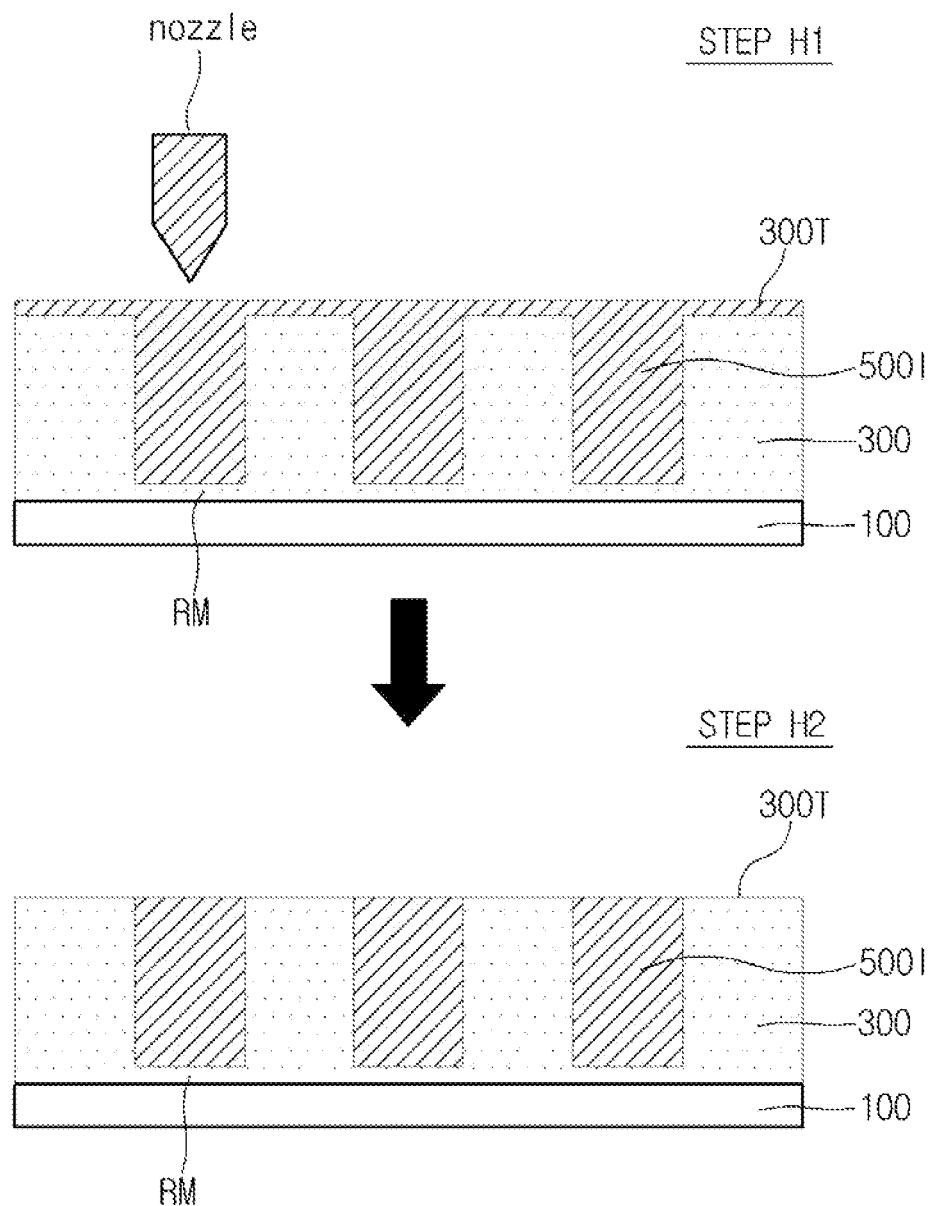
FIG. 19 illustrates a method for manufacturing a high transmission light control film according to Embodiment H of the present disclosure.

FIG. 19 illustrates a method for manufacturing a high transmission light control film according to Embodiment H of the present disclosure.

Referring to FIG. 19, Embodiment H is a modified example of Embodiment G and has a difference in the scheme for ejecting the ink 500I.

When ejecting the ink 500I in STEP H1, the ink 500I made of a light absorbing material is filled into the slot 350 in a printing manner using an inkjet nozzle. In the dotting manner of Embodiment G, the ink 500I is selectively filled only in the position of the slot 350, but in the printing manner of Embodiment H, the ink 500I is printed on the top surface 300T of the light transmitting layer 300 as well as the inside of the slot. Therefore, the ink 500I printed on the top surface 300T of the light transmitting layer 300 should be removed by a wiping process (STEP H2). The processes thereafter are the same as those of Embodiment G.

Meanwhile, in order to fill the ink 500I in the printing manner, it is preferable that the light transmitting layer 300 and the ink 500I have the same physical properties so that the ink 500I can flow along the inner wall of the slot 350. For example, in order to uniformly form the louver layer 500 on the inner wall of the slot, when the light transmitting layer 300 is hydrophobic, the ink 500I should also be hydrophobic, and when the light transmitting layer 300 is hydrophilic, the ink 500I should also be a material having hydrophilicity.

Embodiment J

Figure 20:
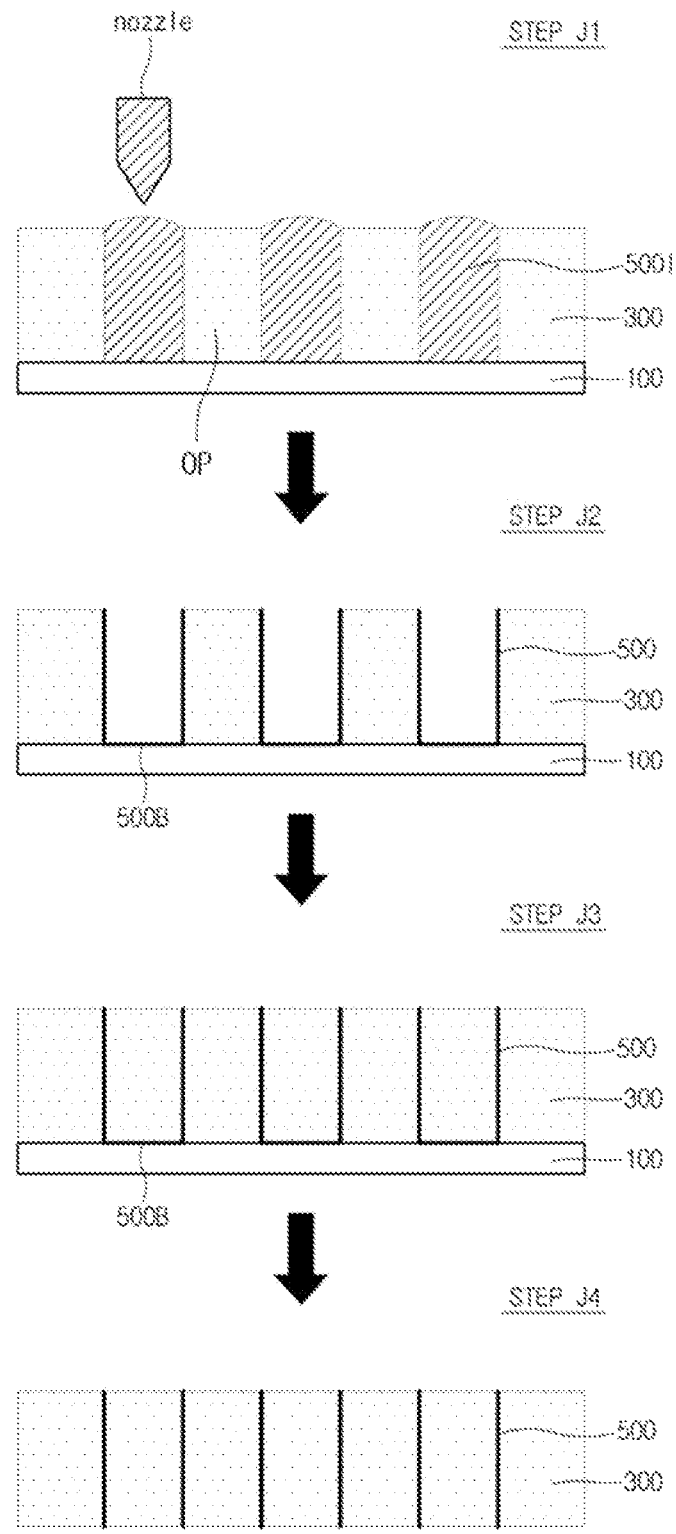
FIG. 20 illustrates a method for manufacturing a high transmission light control film according to Embodiment J of the present disclosure.

FIG. 20 illustrates a method for manufacturing a high transmission light control film according to embodiment J of the present disclosure.

Referring to FIG. 20, Embodiment J is a modified example of Embodiment G and has a difference in the shape of the light transmitting layer 300.

A method for manufacturing a high transmission light control film according to Embodiment J includes forming a light transmitting layer 300 including a plurality of opening portions OP on a lower layer 100 (STEP J0); ejecting ink 500I made of a light absorbing material into the opening portions OP using an inkjet nozzle (STEP J1); forming a louver layer 500 by drying the ink (STEP J2); filling the plurality of opening portions OP with resin (STEP J3); and delaminating the lower layer 100 from the light transmitting layer 300, the louver layer 500 and the resin (STEP J4).

Forming the light transmitting layer 300 of STEP J0 is the same as that described in Example G. However, there is a difference therebetween in the presence or absence of the imprinting residual membrane RM. Embodiment G is a case in which the residual membrane RM is present, and the light transmitting layer 300 includes a slot 350. On the other hand, Example J is a case in which there is no residual membrane RM, and is different in that opening portions OP exposing the lower layer 100 are respectively formed between the light transmitting layers 300.

The step of ejecting the ink 500I of STEP J1 and the step of forming the louver layer 500 of STEP J2 are the same as STEPS G1 and G2 of Embodiment G.

The step of filling with the resin of STEP J3 is the same as STEP E3 of Embodiment E.

The step of the delaminating of STEP J4 is delaminating the lower layer 100 from the light transmitting layer 300, the louver layer 500 and the resin. Films are attached to the upper and lower surfaces thereafter so that forming the high-transmission light control film is completed (refer to STEP F5 shown in FIG. 17).

As described above, the high transmission light control film manufactured according to an embodiment of the present disclosure has a high aperture ratio because the louver layer 500 is formed of a thin deposition film having a thickness of nanoscale, thereby having an improved front-view luminance.

It should be understood that the above-described embodiments are illustrative in all aspects and do not limit the present disclosure. The protective scope of the present disclosure should be construed with respect to the following claims, and all the technical concepts in the equivalent scope thereof should be construed as falling within the scope of the present disclosure.

What is claimed is:

1. A method for manufacturing a transmission light control film, the method comprising:
    forming a light transmitting layer including a plurality of slots on a lower layer;
    forming a louver layer by depositing a light absorbing material on the light transmitting layer;
    filling the plurality of slots with resin; and
    after the filling the plurality of slots with the resin, peeling off the louver layer deposited on a top surface of the light transmitting layer,
    wherein the peeling off the louver layer is a selective peeling off of the louver layer using a pressure-sensitive adhesive or a UV (ultraviolet) release adhesive.

2. The method of claim 1, wherein the forming the louver layer comprises:
depositing the light absorbing material at a first angle to a line vertical to the lower layer; and
depositing the light absorbing material at a second angle symmetrical to the first angle with respect to the line.

3. The method of claim 1, further comprising:
removing the louver layer deposited on the top surface of the light transmitting layer.

4. The method of claim 1, further comprising:
etching the louver layer deposited on the top surface of the light transmitting layer.

5. The method of claim 1, further comprising:
after the filling with the resin, etching the top surface of the light transmitting layer and an upper portion of the resin.

6. The method of claim 1, wherein the forming the light transmitting layer is through an imprinting scheme.

7. A method for manufacturing a transmission light control film, the method comprising:
forming a plurality of light transmitting layers on a lower layer;
forming a louver layer by depositing a light absorbing material; and
filling with resin,
wherein opening portions exposing the lower layer are respectively formed between the plurality of light transmitting layers,
wherein the plurality of light transmitting layers each have a cross-section of a right triangle, and each include an inclined plane and a vertical plane perpendicular to the lower layer, and
wherein the forming the louver layer comprises depositing the light absorbing material on any one of the vertical plane and the inclined plane.

8. The method of claim 7, wherein the forming the louver layer comprises depositing the light absorbing material at an angle greater than 0 degrees and less than an angle formed by the inclined plane and the lower layer.

9. The method of claim 7, wherein the forming the louver layer further comprises, after the depositing the light absorbing material, etching the light absorbing material deposited in the opening portions.

10. The method of claim 7, wherein the plurality of light transmitting layers are formed by patterning via a photolithography process or an electron beam lithography process.

* * * * *